(12) United States Patent
Kurose

(10) Patent No.: US 6,888,454 B2
(45) Date of Patent: May 3, 2005

(54) FAULT DIAGNOSIS CIRCUIT FOR LED INDICATING LIGHT

(75) Inventor: Takahiro Kurose, Sakai (JP)

(73) Assignee: Patlite Corporation, Osaka (JP)

( * ) Notice: Subject to any disclaimer, the term of this patent is extended or adjusted under 35 U.S.C. 154(b) by 0 days.

(21) Appl. No.: 10/352,810

(22) Filed: Jan. 28, 2003

(65) Prior Publication Data
US 2003/0160703 A1 Aug. 28, 2003

(30) Foreign Application Priority Data
Feb. 25, 2002 (JP) ........................................ 2002-048318

(51) Int. Cl.$^7$ .............................................. G08B 29/00
(52) U.S. Cl. ...................... 340/514; 340/635; 340/657; 340/659; 340/664; 324/537; 632/800
(58) Field of Search ................................ 340/664, 635, 340/652; 324/763, 556

(56) References Cited

U.S. PATENT DOCUMENTS 6,147,617 A  *  11/2000  Kim ........................... 340/664
6,490,512 B1  *  12/2002  Niggemann ................... 701/29
2002/0140380 A1  *  10/2002  Biebl ........................... 315/291
2003/0133491 A1  *  7/2003  Shih ............................ 374/163

FOREIGN PATENT DOCUMENTS

JP          5-038703          5/1993

* cited by examiner

Primary Examiner—Julie B. Lieu
(74) Attorney, Agent, or Firm—Koda & Androlia

(57) ABSTRACT

A fault diagnosis circuit of the present invention includes: LED indicating units 3a, 3b, and so forth; current detecting circuits R1 and Q1 for detecting a flowing current by flowing a short-time pulse of a current through the LED indicating units 3a, 3b, and so forth based on pulses generated by a pulse generating circuit 7; comparing circuits 8 and 9 for comparing a current value detected by the current detecting circuits R1 and Q1 with their respective threshold values to judge a disconnection and a short-circuit; and retaining circuits 10 and 11 for generating a signal and retaining the signal when the current value is judged as being smaller and larger than the respective threshold values as a result of comparisons by the corresponding comparing circuits 8 and 9. Thus, it is possible to indicate a fault in an LED indicating light to the outside while making the turning ON of an LED unperceivable.

4 Claims, 5 Drawing Sheets

FAULT DIAGNOSIS CIRCUIT FOR LED INDICATING LIGHT

TECHNICAL FIELD

The present invention relates to a fault diagnosis circuit allowing a fault diagnosis in an indicating light having an LED indicator, such as a signal indicating light, a character display panel, a signal, and a fire alarm.

RELATED BACKGROUND ART

Indicating lights have been provided to lines and machine and equipment in factories to indicate an operation status, an abnormality, a fault, etc. of the lines and equipment.

Some of the recent indicating lights adopt a light emitting diode (LED: an element that emits light by flowing a current through a PN junction of a semiconductor) (hereinafter, referred to as the LED indicting light).

FIG. 5 shows perspective views of the LED indicating lights. FIG. 5(a) shows a single-stage type having an indicator in one stage, and FIG. 5(b) shows a multi-stage type having indicators stacked in more than one stage. The multi-stage type can emit light in more than one color, which allows a current status to be judged by color discrimination of emitted light.

When the LED indicating light fails, the status of the lines or equipment cannot be judged, and therefore, it is necessary to monitor the occurrence of an abnormality in the indicator of the LED indicating light.

There has been known a technique of detecting a disconnection in a lamp or a disconnection in the indicator by constantly flowing a minimal current too small to turn ON the lamp (see Japanese Laid-open utility Model No. 5-038703 (1993)). However, this technique is intended for lamps having filaments.

The above method of constantly flowing a minimal current cannot be adapted to the LED indicating light, because the LED turns ON with such a minimal current.

It is therefore an object of the present invention to achieve a circuit allowing a fault diagnosis in the LED indicating light while making the turning ON of the LED unperceivable by human sense.

SUMMARY OF THE INVENTION

A fault diagnosis circuit for an LED indicating light of the present invention includes: an LED indicating unit; a pulse generating circuit; a current detecting circuit for detecting a flowing current by flowing a pulse of a current through the LED indicating unit based on pulses generated by the pulse generating circuit; a comparing circuit for comparing a current value detected by the current detecting circuit with a threshold value to judge a disconnection; a retaining circuit for generating a signal and retaining the signal when the current value is judged as being smaller than the threshold value as a result of a comparison by the comparing circuit; and an output circuit for outputting a disconnection notifying signal based on the signal retained by the retaining circuit.

A fault diagnosis circuit for an LED indicating light of the present invention includes: an LED indicating unit; a pulse generating circuit; a current detecting circuit for detecting a flowing current by flowing a pulse of a current through the LED indicating unit based on pulses generated by the pulse generating circuit; a comparing circuit for comparing a current value detected by the current detecting circuit with a threshold value to judge a short-circuit; a retaining circuit for generating a signal and retaining the signal when the current value is judged as being larger than the threshold value as a result of a comparison by the comparing circuit; and an output circuit for outputting a short-circuit notifying signal based on the signal retained by the retaining circuit.

According to each of the above arrangements, because a pulse of a current is flown through the LED indicating unit, even when an LED emits light, it becomes difficult to perceive emitted light by sight. The pulse of the current is compared with the threshold value, and the comparison result is retained and outputted as a notification. Hence, the manager can diagnose a fault in the LED indicating unit by checking a notification output without perceiving the turning ON of the LED.

A fault diagnosis circuit for an LED indicating light of the present invention includes: an LED indicating unit; a pulse generating circuit; a current detecting circuit for detecting a flowing current by flowing a pulse of a current through the LED indicating unit based on pulses generated by the pulse generating circuit; a first comparing circuit for comparing a current value detected by the current detecting circuit with a first threshold value to judge a disconnection; a second comparing circuit for comparing the current value detected by the current detecting circuit with a second threshold value to judge a short-circuit; a retaining circuit for generating a signal and retaining the signal when the current value is judged as being larger than the first threshold value to judge the disconnection and smaller than the second threshold value to judge the short-circuit as a result of comparisons by the first and second comparing circuits; and an output circuit for outputting a normality notifying signal based on the signal retained by the retaining circuit.

According to this arrangement, because a pulse of a current is flown through the LED indicating unit, even when an LED emits light, it becomes difficult to perceive emitted light by sight. The pulse of the current is compared with the threshold values, and the comparison result is retained and outputted as a notification. Hence, the manager can diagnose a normality in the LED indicating unit by checking a notification output without perceiving the turning ON of the LED.

When it is arranged in such a manner that the pulse generating circuit generates pulses repetitively and the retaining circuit retains the signal during a pulse repetition cycle, the notification output is outputted constantly. Hence, the manager can check the notification output anytime.

It is preferable to set a time width of the pulse of the current flown through the LED indicating unit too short to perceive light emitted from an LED by sight.

In the following, embodiments of the present invention will be described in detail with reference to the accompanying drawings.

DESCRIPTION OF THE SPECIAL EMBODIMENTS

Figure 1:
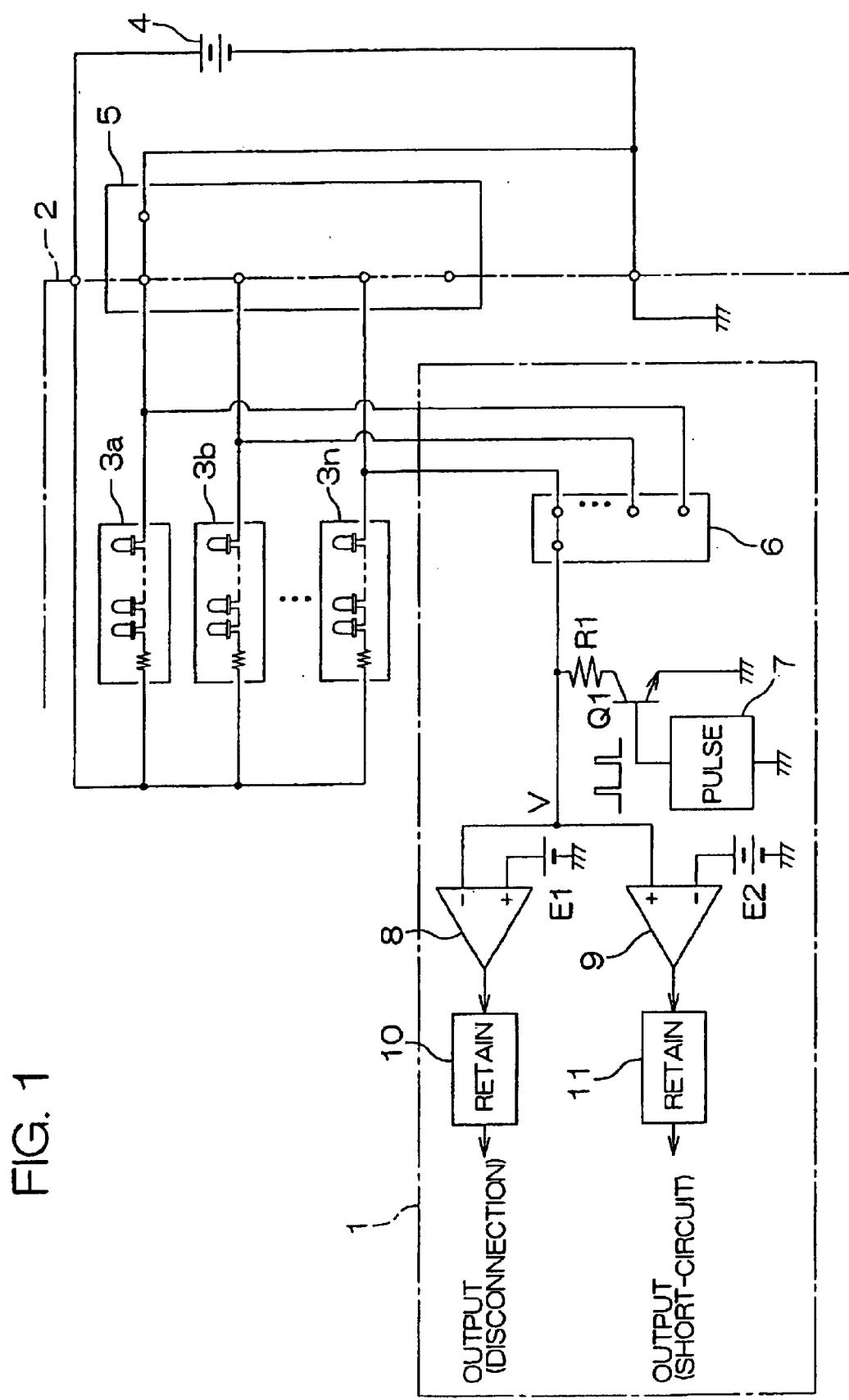
FIG. 1 is a circuit diagram depicting an LED indicating light 2 and its fault diagnosis circuit 1.

FIG. 1 is a circuit diagram showing an LED indicating light 2 and its fault diagnosis circuit 1. The LED indicating light 2 is provided with an outside direct current power source 4, an outside contact 5, and indicating units stacked in multiple stages 3a, 3b, and so forth each enclosing a plurality of LEDs. The colors of light emitted from the LEDs in the indicating units in the respective stages 3a, 3b, and so forth may be the same or different.

The LEDs in any of the stages 3a, 3b, and so forth are allowed to emit light by switching the outside contact 5 depending on an operation status of the lines or machine and equipment in the factory.

The terminals at the lower potential in the LEDs in the respective stages 3a, 3b, and so forth are connected to the collector terminal of a transistor Q1 through a resistor R1 by way of an automatic selection switch 6 provided in the fault diagnosis circuit 1. Also, these terminals are connected to comparing circuits 8 and 9 by way of the automatic selection switch 6. The base terminal of the transistor Q1 periodically receives pulses of a constant width generated from a pulse generating circuit 7.

The comparing circuit 8 compares an input voltage V with a threshold value E1 while the pulses of a constant width are generated, and when the voltage V is lower than the threshold value E1, it outputs an output at a constant level. The output is retained by a retaining circuit 10 until the following pulse is inputted.

The comparing circuit 9 compares the input voltage V with another threshold value E2 (E1<E2) while the pulses of a constant width are generated, and when the voltage V is higher than the threshold value E2, it outputs an output at a constant level. The output is retained by another retaining circuit 11 until the following pulse is inputted.

The following description will describe the method of setting the threshold value E1 and the threshold value E2. When a normal voltage is applied to an LED from the direct current power source 4, if a too large current flows, it can be judged that the LED short-circuits or a short-circuit is occurring in an LED driving circuit (due to the mixing of conductor fragments, for example). If no current or a too small current flows, it can be judged that the LED is disconnected or an abnormality, such as a disconnection, is occurring in the LED driving circuit.

Figure 2:
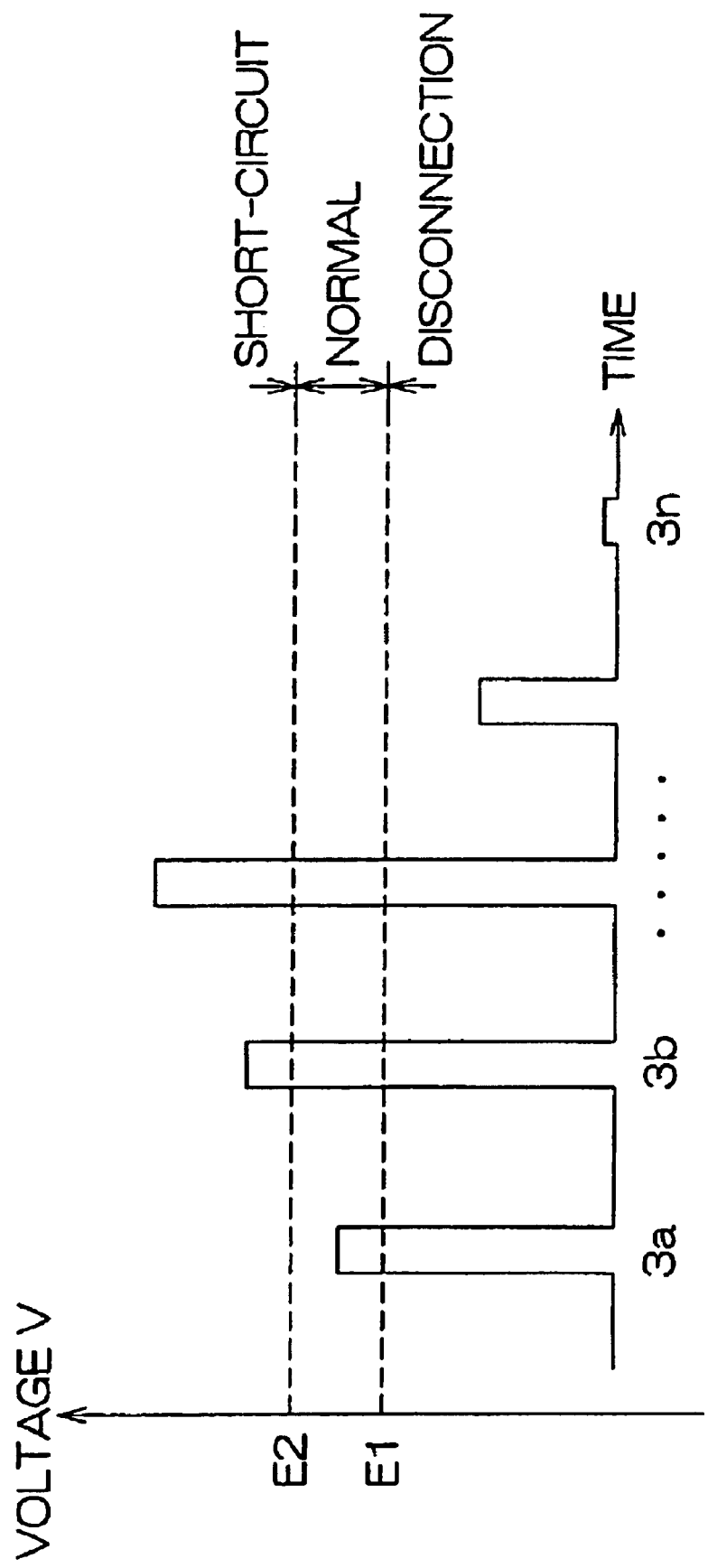
FIG. 2 is a graph showing a relation between a voltage V, which is converted from a current flowing through LEDs in each stage, and threshold values.

Hence, a current flown through the LEDs in each stage is converted to a voltage V, and as shown in FIG. 2, the threshold value E2 is set at a level that an occurrence of a short-circuit is likely from experiences and the threshold value E1 is set at a level that an occurrence of a disconnection is likely from experiences, so that a short-circuit is judged when the voltage V is higher the threshold value E2 and a disconnection is judged when the voltage V is lower than the threshold value E1.

With the circuit of FIG. 1, it is possible to judge a short-circuit and a disconnection in each of the stages 3a, 3b, and so forth in the LED indicating light 2 by checking an output voltage from each of the retaining circuits 10 and 11 while switching the positions in the selection switch 6 one by one. It should be noted that the switching period of the selection switch 6 has to be longer than the pulse generation cycle of the pulse generating circuit 7.

While the pulses of a constant width are generated from the pulse generating circuit 7, an LED in any of the stages 3a, 3b, and so forth turns ON. However, by setting the pulse width too short to perceive emitted light by sight, it is possible to forestall erroneous perception as to the LED indicating light 2. For example, the pulse width may be set to 100 microseconds or less.

Figure 3:
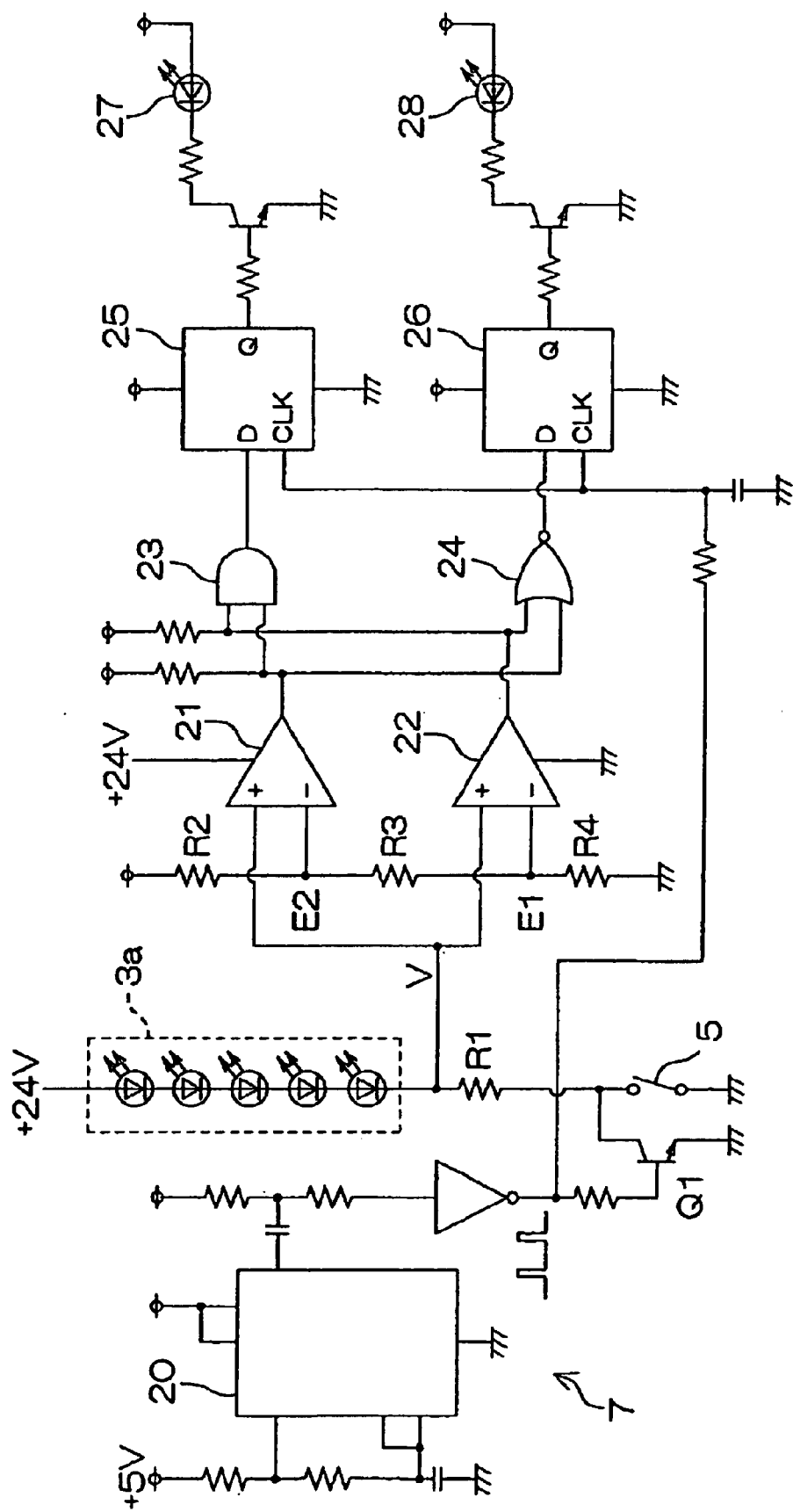
FIG. 3 is a detailed circuit diagram depicting a fault diagnosis circuit for diagnosing a short-circuit and a disconnection.

Next, the following description will describe a more concrete example of the circuit. FIG. 3 is a detailed circuit diagram of a fault diagnosis circuit for judging a short-circuit and a disconnection.

Figure 5A:
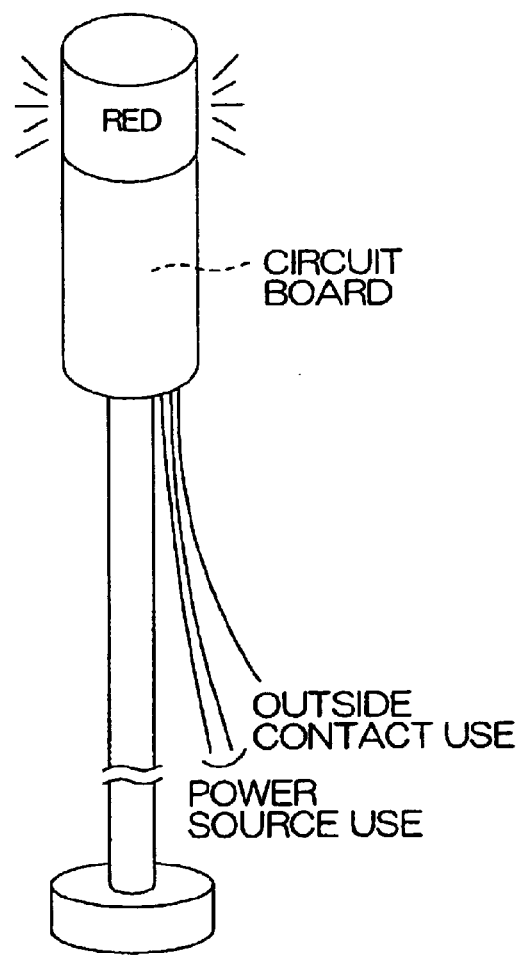
FIG. 5 is a perspective view of LED indicating lights.

FIG. 3 shows a circuit for diagnosing only one stage in the LED indicating light, which means it is a fault diagnosis circuit corresponding to an LED indicating light of the single-stage type having an indicator in one stage as shown in FIG. 5(a).

Figure 5B:
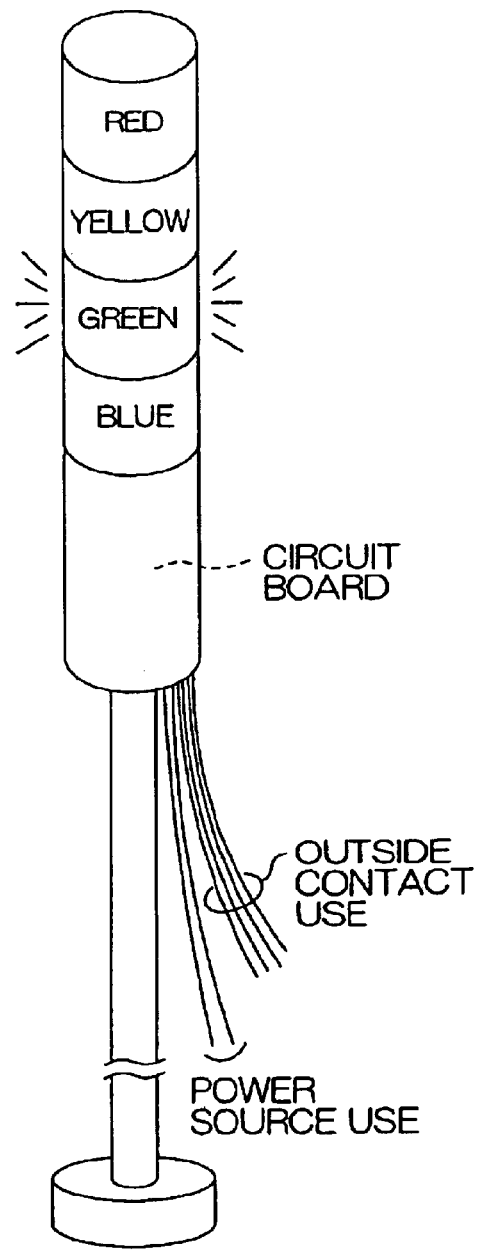

In order to correspond to an LED indicating light of the multi-stage type having indicators stacked in more than one stage as shown in FIG. 5(b), a circuit having a switch for switching LEDs in multiple stages (see Reference Numeral 6 in FIG. 1) has to be adopted.

Referring to FIG. 3, a special-purpose IC20 (NE555) is used for pulse generation. A pulse signal of a predetermined cycle (for example, every 5 seconds) can be obtained by using the IC20.

The resistor R1 and the transistor Q1 function in the same manner as were described with reference to FIG. 1.

Herein, operational amplifiers 21 and 22 and logical circuits 23 and 24 are used as the comparing circuits. The threshold value E1 and the threshold value E2 are generated by resistors R2, R3, and R4. When a voltage V at one end of the resistor R1 is higher than the threshold E2, the operational amplifier 21 outputs a high-level output, and when the voltage V is higher than the threshold value E1, the operational amplifier 22 also outputs a high-level output.

Wiring is installed in such a manner that the logical product (AND) circuit 23 receives outputs from both the operational amplifiers 21 and 22 as inputs, and that the non-disjunction (NOR) circuit 24 also receives outputs from both the operational amplifiers 21 and 22 as inputs.

This arrangement results as follows: (1) when the voltage V at the resistor R1 is higher than the threshold value E2, the AND circuit 23 is at a high level and the NOR circuit 24 is at a low level; (2) when the voltage V at the resistor R1 is not lower than the threshold value E1 and not higher than the threshold value E2, the AND circuit 23 is at a low level and the NOR circuit 24 is also at a low level; and (3) when the voltage V at the resistor R1 is lower than the threshold value E1, the AND circuit 23 is at a low level and the NOR circuit 24 is at a high level. It should be noted that the AND circuit 23 and the NOR circuit 24 will never be at a high level concurrently.

Subsequently, an output from the AND circuit 23 is latched by a D-type latch circuit 25 until the following pulse signal is inputted, and the result is indicated by an indicating light 27. On the other hand, an output from the NOR circuit 24 is latched by a D-type latch circuit 26 until the following pulse signal is inputted, and the result is indicated by an indicating light 28.

As a consequence, anyone around can judge a short-circuit when the indicating light 27 turns ON and a disconnection when the indicating light 28 turns ON.

Figure 4:
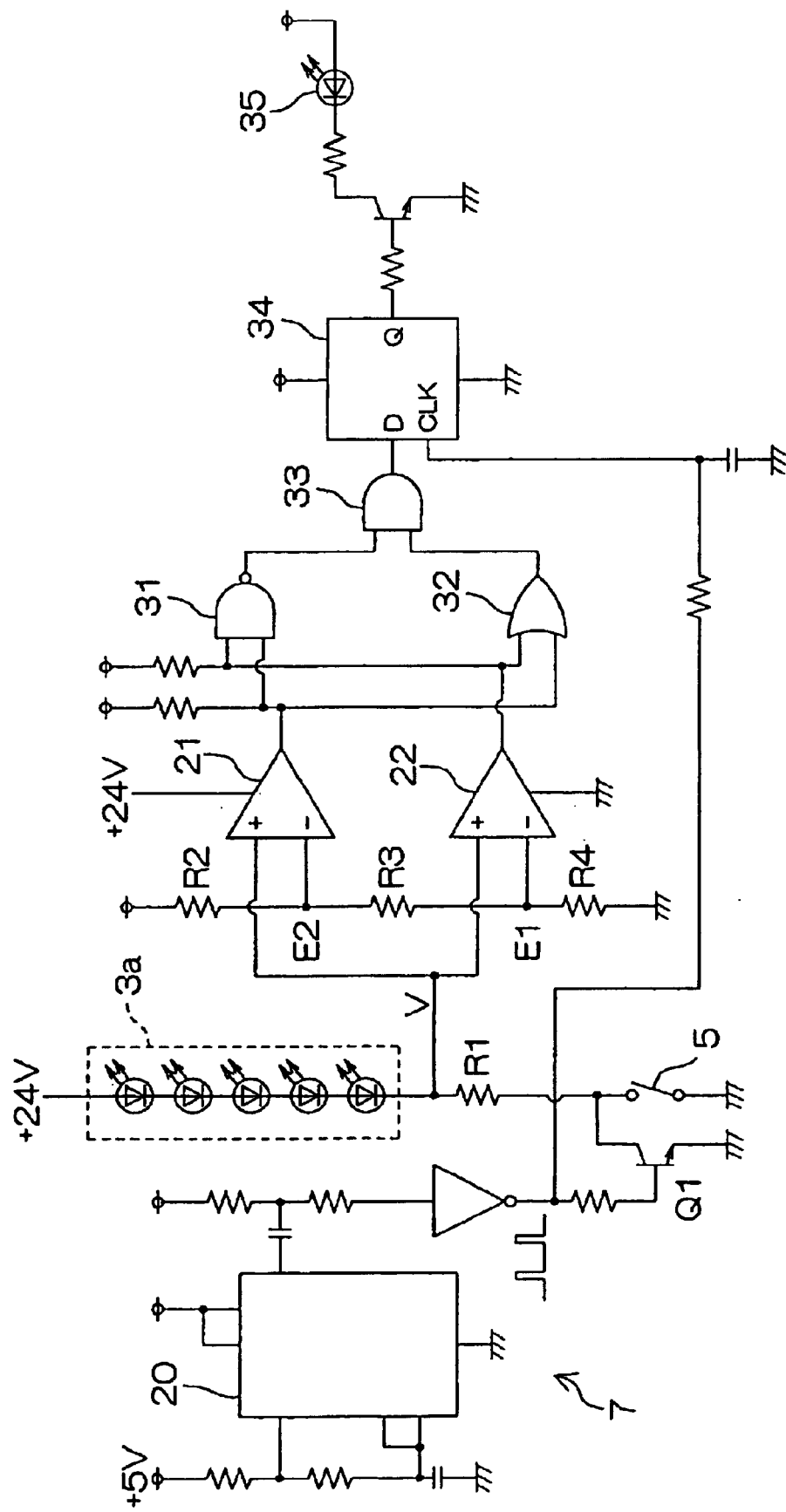
FIG. 4 is a detailed circuit diagram depicting a fault diagnosis circuit for outputting indication during a normal operation.

FIG. 4 is a detailed circuit diagram showing another fault diagnosis circuit. FIG. 4 also shows a circuit for diagnosing only one stage in the LED indicating light, and it should be appreciated that a circuit having a switch for switching LEDs in multiple stages (see Reference Numeral 6 in FIG. 1) may be adopted in order to correspond to an LED indicating light of the multi-stage type having indicators stacked in more than one stage.

This circuit uses operational amplifiers 21 and 22 and logical circuits 31, 32, and 33 as the comparing circuits. The threshold value E1 and the threshold value E2 are generated by resistors R2, R3, and R4. When a voltage V at the resistor R1 is higher than the threshold value E2, the operational amplifier 21 outputs a high-level output, and when the voltage V at the resistor R1 is higher than the threshold E1, the operational amplifier 22 also outputs a high-level output.

Wiring is installed in such a manner that the non-conjunction (NAND) circuit 31 receives outputs from both the operational amplifiers 21 and 22 as inputs, and that the logical sum (OR) circuit 32 also receives outputs from both the operational amplifiers 21 and 22 as inputs.

This arrangement results as follows: (1) when the voltage V at the resistor R1 is higher than the threshold value E2, the NAND circuit 31 is at a low level and the OR circuit 32 is at a high level; (2) when the voltage V at the resistor R1 is not lower than the threshold value E1 and not higher than the threshold value E2, the NAND circuit 31 is at a high level and the OR circuit 32 is also at a high level; and (3) when the voltage V at the resistor R1 is lower than the threshold value E1, the NAND circuit 31 is at a high level and the OR circuit 32 is at a low level. It should be noted that the NAND circuit 31 and the OR circuit 32 will never be at a low level concurrently.

An output from the NAND circuit 31 and an output from the OR circuit 32 are inputted into the AND circuit 33, and the AND circuit 33 outputs a signal only when the output from the NAND circuit 31 and the output from the OR circuit 32 are both at a high level, that is, in the status of (2) above.

The outputted signal is latched by a D-type latch circuit 34 until the following signal is inputted, and the result is indicated by an indicating light 35.

Consequently, when the indicating light 35 stays ON, anyone around can judge a normal status that neither a short-circuit nor a disconnection is occurring. When the indicating light 35 is turned OFF, anyone around can judge an abnormality, that is, either a short-circuit or a disconnection, is occurring in the indicator.

The above description described embodiments of the present invention. It should be appreciated, however, that the present invention is not limited to the foregoing. For example, instead of notifying the diagnosis result by the indicating light 35, the diagnosis result may be notified by a buzzer, an alarm, a data output, etc.

The present invention can be modified in various manners within the scope of the invention.

What is claimed is:

1. A fault diagnosis circuit for an LED indicating light, characterized by:
    an LED indicating unit (3a, 3b);
    a pulse generating circuit (7);
    a current detecting circuit (R1, Q1) for detecting a flowing current by flowing a pulse of a current through said LED indicating unit (3a, 3b) based on pulses generated by said pulse generating circuit (7);
    a comparing circuit (8, 22) for comparing a current value detected by said current detecting circuit (R1, Q1) with a threshold value (E1) to judge a disconnection;
    a remaining circuit (10, 26) for generating a signal and retaining the signal when the current value is judged as being smaller than the threshold value (E1) as a result of a comparison by said comparing circuit (8,22); and
    an output circuit (28) for outputting a disconnection notifying signal based on the signal retained by said retaining circuit (10, 26); and wherein:
    a time width of the pulse of the current flown through said LED indicating unit (3a, 3b) is set too short to perceive light emitted from said LED by sight.

2. A fault diagnosis circuit for an LED indicating light, characterized by;
    an LED indicating unit (3a, 3b);
    a pulse generating circuit (7);
    a current detecting circuit (R1, Q1) for detecting a flowing current by flowing a pulse of a current through said LED indicating unit (3a, 3b) based on pulses generated by said pulse generating circuit (7);
    a comparing circuit (9, 21) for comparing a current value detected by said current detecting circuit (R1, Q1) with a threshold value (E2) to judge a short-circuit;
    a retaining circuit (11, 25) for generating a signal and retaining the signal when the current value is judged as being larger than the threshold value (E2) as a result of a comparison by said comparing circuit (9, 21); and
    an output circuit (27) for outputting a short-circuit notifying signal based on the signal retained by said retaining circuit (11, 25); and wherein:
    a time width of the pulse of the current flown through said LED indicating unit (3a, 3b) is set too short to perceive light emitted from said LED by sight.

3. A fault diagnosis circuit for an LED indicating light, characterized by:
    an LED indicating unit (3a, 3b);
    a pulse generating circuit (7);
    a current detecting circuit (R1, Q1) for detecting a flowing current by flowing a pulse of a current through said LED indicating unit (3a, 3b) based on pulses generated by said pulse generating circuit (7);
    a first comparing circuit (22) for comparing a current value detected by said current detecting circuit (R1, Q1) with a first threshold value (E1) to judge a disconnection;
    a second comparing circuit (21) for comparing the current value detected by said current detecting circuit (R1, Q1) with a second threshold value (E2) to judge a short-circuit;
    retaining circuit (34) for generating a signal and retaining the signal when the current value is judged as being larger than the first threshold value (E1) to judge the disconnection and smaller than the second threshold value (E2) to judge the short-circuit as a result of comparisons by said first and second comparing circuits (21, 22); and
    an output circuit (35) for outputting a normality notifying signal based on the signal retained by said retaining circuit (34); and wherein:
    a time width of the pulse of the current flown through said LED indicating unit (3a, 3b) is set too short to perceive light emitted from said LED by sight.

4. The fault diagnosis circuit for an LED indicating light according to claim 1, 2, 3, wherein:
    said pulse generating circuit (7) generates pulses respectively; and
    said retaining circuit (10, 11, 25, 26, 34) retains and the signal during a pulse repetition cycle.

* * * * *